(12) United States Patent
Kraemer et al.

(10) Patent No.: US 11,380,495 B2
(45) Date of Patent: Jul. 5, 2022

(54) ELECTRICAL EQUIPMENT AND ADDITIONAL FUNCTIONAL MODULE ASSOCIATED THEREWITH

(71) Applicant: BERKER GmbH & Co. KG, Schalksmuhle (DE)

(72) Inventors: Jacques Kraemer, Strasbourg (FR); Pascal Noel, Wiwersheim (FR)

(73) Assignee: BERKER GmbH & Co. KG, Schalksmuhle (DE)

( * ) Notice: Subject to any disclaimer, the term of this patent is extended or adjusted under 35 U.S.C. 154(b) by 191 days.

(21) Appl. No.: 16/627,658

(22) PCT Filed: Jul. 10, 2017

(86) PCT No.: PCT/EP2017/067250
§ 371 (c)(1),
(2) Date: Dec. 30, 2019

(87) PCT Pub. No.: WO2019/011401
PCT Pub. Date: Jan. 17, 2019

(65) Prior Publication Data
US 2021/0159029 A1      May 27, 2021

(51) Int. Cl.
*H01H 9/02* (2006.01)
*H05K 5/02* (2006.01)
*H05K 5/03* (2006.01)

(52) U.S. Cl.
CPC ............ *H01H 9/0271* (2013.01); *H01H 9/02* (2013.01); *H05K 5/0286* (2013.01); *H05K 5/03* (2013.01); *Y02B 90/20* (2013.01); *Y04S 20/14* (2013.01)

(58) Field of Classification Search
CPC ........ Y04S 20/14; H05K 5/0286; H05K 5/03; H01H 21/06; H01H 2300/03; H01H 9/02; H01H 9/26; H01H 9/0271; Y02B 90/20; H02G 3/12
See application file for complete search history.

(56) References Cited

U.S. PATENT DOCUMENTS

| 2012/0262006 | A1  | 10/2012 | Elberbaum |
| 2014/0117859 | A1  | 5/2014  | Swatsky et al. |
| 2016/0225562 | A1* | 8/2016  | Franks ................. H02H 3/006 |
| 2017/0099719 | A1  | 4/2017  | Smith et al. |
| 2021/0066014 | A1* | 3/2021  | Gibson ................ H01H 83/144 |
| 2021/0083506 | A1* | 3/2021  | Rao ................... H02J 13/00002 |
| 2021/0298153 | A1* | 9/2021  | Hampel .............. F21V 23/0435 |

OTHER PUBLICATIONS

International Search Report dated Mar. 6, 2018.

* cited by examiner

*Primary Examiner* — Jared Fureman
*Assistant Examiner* — Esayas G Yeshaw
(74) *Attorney, Agent, or Firm* — Ipsilon USA, LLP

(57) ABSTRACT

An electrical equipment for an electrical installation connected to an electrical grid, has at least: a primary functional module (2) suitable for carrying out a current interruption function, and an additional functional module (5) for carrying out a function requiring a power supply The function of the additional functional module (5) is a function requiring a power supply except for an indicator light lighting function.

29 Claims, 7 Drawing Sheets

ELECTRICAL EQUIPMENT AND ADDITIONAL FUNCTIONAL MODULE ASSOCIATED THEREWITH

RELATED APPLICATION

This application is a National Phase of PCT/EP2017/067250 filed on Jul. 10, 2017, the entirety of which is incorporated by reference.

BACKGROUND

Field of the Invention

The present invention relates to an electrical apparatus for an electrical installation and to an additional functional module for this electrical apparatus.

Description of Related Art

Document DE 19 21 571 A1 describes an electrical switch comprising a lighting element connected in parallel with the electrical circuit of the electrical switch in order to perform an indicator light function. Such an electrical switch only makes it possible to perform an indicator light function. This electrical switch therefore does not make it possible to implement more sophisticated functionalities, and is therefore limited.

Objects and Summary

The present invention aims to propose a flexible and customizable solution for an electrical apparatus and to overcome the drawbacks of the prior art.

The present invention relates to an electrical apparatus for an electrical installation, able and intended to be connected to an electrical grid, comprising at least:
  a reception module comprising at least a first reception area;
  a primary functional module received in the first reception area and comprising a first connection pole able and intended to be connected to a first line of the electrical grid and a second connection pole able and intended to be connected to a second line of an electrical circuit of the electrical installation,
  the primary functional module comprising a device for interrupting the current, which device is arranged between the first connection pole and the second connection pole and is able, in an open position, to interrupt the current between the first connection pole and the second connection pole and, in a closed position, to allow the passage of the current between the first connection pole and the second connection pole,
  which electrical apparatus is characterized in that the reception module comprises a second reception area for receiving an additional functional module comprising means for performing at least one function requiring an electric power supply, the additional functional module comprising at least a fourth connection pole and a fifth connection pole that are able to be electrically connected respectively to the first connection pole and to the second connection pole of the primary functional module in order to supply power to the additional functional module and in that either the electrical apparatus comprises an interruption element able to act on the interruption device so as to interrupt the flow of the current between the first connection pole and the second connection pole when the additional functional module is received in the second reception area, or an interruption element of the additional functional module is able to act on the interruption device so as to interrupt the flow of the current between the first connection pole and the second connection pole when the additional functional module is received in the second reception area.

The invention also relates to an additional functional module for an electrical apparatus according to the invention, which functional module is able to be received in the second reception area of the electrical apparatus, the additional functional module comprising at least a fourth connection pole and a fifth connection pole that are able to be electrically connected respectively to the first connection pole and to the second connection pole of the primary functional module of the electrical apparatus in order to supply power to the additional functional module and comprises means for performing at least one function requiring an electric power supply, and wherein either the additional functional module comprises an interruption element able to act on the interruption device so as to interrupt the flow of the current between the first connection pole and the second connection pole when the additional functional module is received in the second reception area of the electrical apparatus, or the additional functional module is able to act on an interruption element of the electrical apparatus acting on the interruption device so as to interrupt the flow of the current between the first connection pole and the second connection pole when the additional functional module is received in the second reception area of the electrical apparatus.

The invention also relates to an electronic card for an additional functional module as described above, characterized in that the electronic card comprises a measurement sensor and/or display means and/or actuation means and/or electromagnetic wave transmission and/or reception means and/or a transducer and in that it comprises at least first connection means so as to be able and intended to form a removable component of said additional functional module.

The invention also relates to an electrical assembly comprising an electrical apparatus according to the invention and an additional functional module according to the invention, said additional functional module being received in the second reception area of the electrical apparatus, the fourth connection pole and the fifth connection pole of the additional functional module being electrically connected respectively to the first connection pole and to the second connection pole of the primary functional module of the electrical apparatus in order to supply power to the additional functional module, and comprises means for performing at least one function requiring an electric power supply, the interruption element acting on the interruption device so as to interrupt the flow of the current between the first connection pole and the second connection pole.

BRIEF DESCRIPTION OF THE DRAWINGS

The invention will be better understood by virtue of the following description, which relates to several preferred embodiments that are given by way of non-limiting example and explained with reference to the appended schematic drawings, in which.

DETAILED DESCRIPTION

Figure 3A:
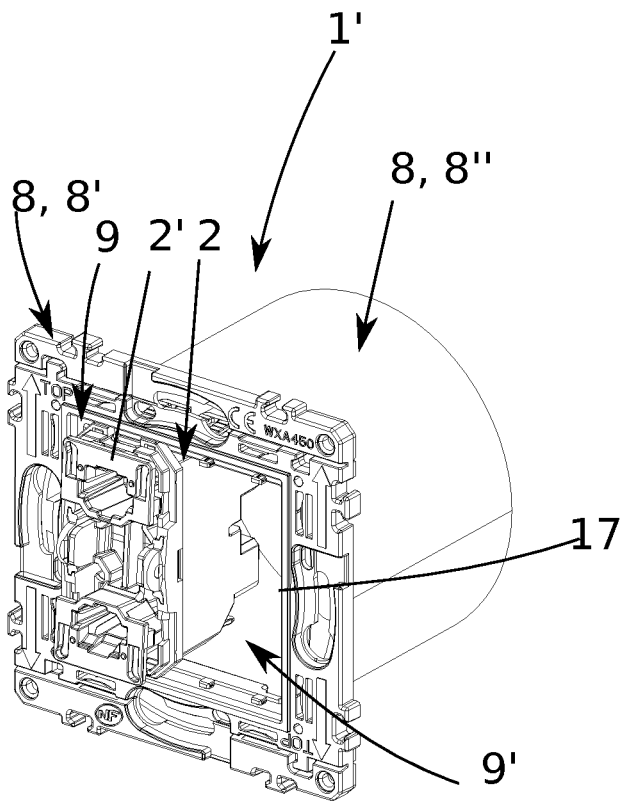
FIG. 3A is a perspective view of the primary functional module according to the invention shown in FIGS. 1A to 1C associated with a support frame of the reception module.
Figure 3B:
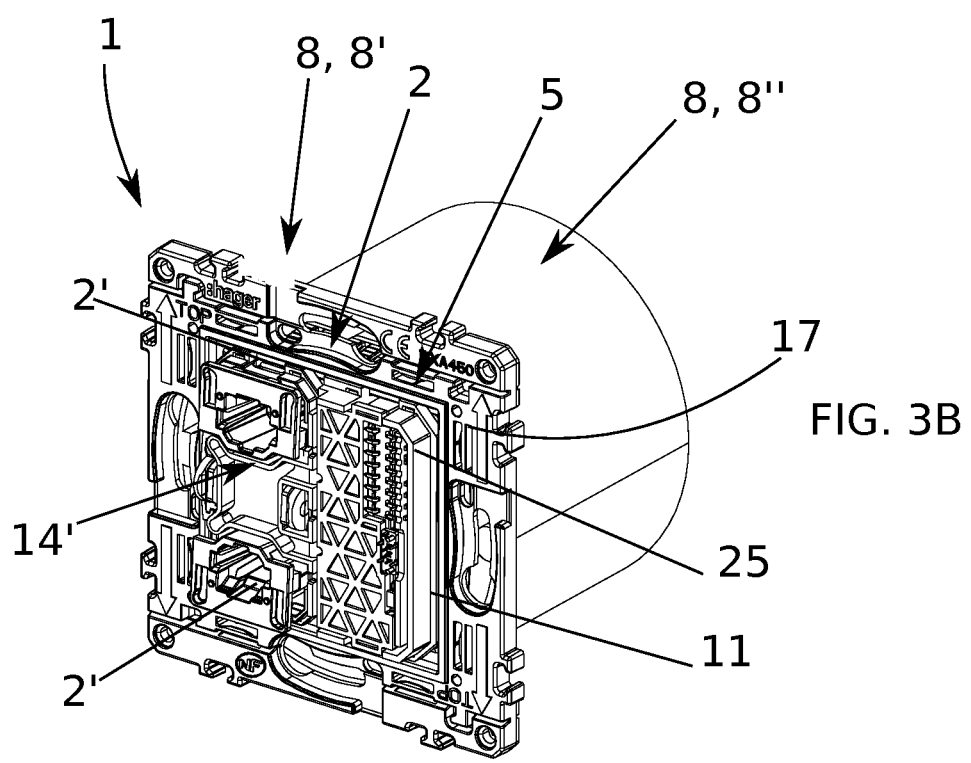
FIG. 3B is a perspective view of the electrical apparatus according to the invention comprising the primary functional module according to the invention shown in FIGS. 1A to 1C and the additional functional module shown in FIGS. 2A to 2E.

The electrical apparatus 1' for an electrical installation, able and intended to be connected to an electrical grid, comprises at least:
- a reception module 8 comprising at least a first reception area 9 (FIGS. 3A to 4);
- a primary functional module 2 received in the first reception area 9 and comprising a first connection pole 3 able and intended to be connected to a first line L of the electrical grid and a second connection pole 4 able and intended to be connected to a second line L1 of an electrical circuit of the electrical installation (FIG. 1B), the primary functional module 2 (FIGS. 1A and 1C) comprising a device 2" for interrupting the current, which device is arranged between the first connection pole 3 and the second connection pole 4 and is able, in an open position, to interrupt the current between the first connection pole 3 and the second connection pole 4 and, in a closed position, to allow the passage of the current between the first connection pole 3 and the second connection pole 4, which electrical apparatus 1' is characterized in that the reception module comprises a second reception area 9' for receiving an additional functional module 5 (FIG. 3A) comprising means for performing at least one function requiring an electric power supply, the additional functional module 5 comprising at least a fourth connection pole 6 and a fifth connection pole 7 that are able to be electrically connected respectively to the first connection pole 3 and to the second connection pole 4 of the primary functional module 2 in order to supply power to the additional functional module 5 and in that either the electrical apparatus 1' comprises an interruption element able to act on the interruption device 2" so as to interrupt the flow of the current between the first connection pole 3 and the second connection pole 4 when the additional functional module 5 is received in the second reception area 9', or an interruption element of the additional functional module 5 is able to act on the interruption device 2" so as to interrupt the flow of the current between the first connection pole 3 and the second connection pole 4 when the additional functional module 5 is received in the second reception area 9'.

The interruption element may therefore either be present on the apparatus 1' or on the additional functional module 5. In these two cases, the interruption element is designed to be able to act on the interruption device 2" so as to interrupt the flow of the current between the first connection pole 3 and the second connection pole 4 when the additional functional module 5 is received in the second reception area 9'.

Figure 6:
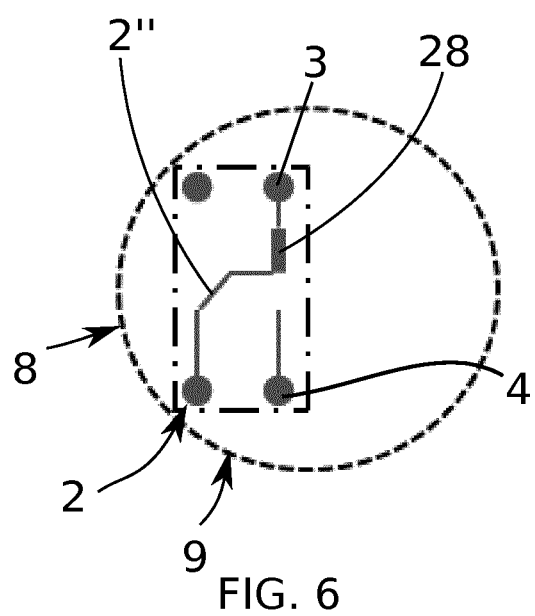
FIG. 6 is a view of a circuit diagram showing the primary functional module.
Figure 7:
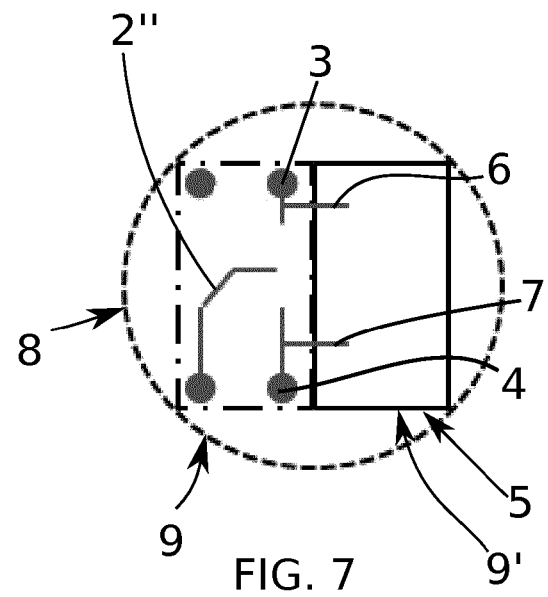
FIG. 7 is a view of a circuit diagram showing the primary functional module and the additional functional module.

The interruption device 2" may furthermore comprise a shunt 28 able to establish the flow of the current between the first connection pole 3 and the second connection pole 4 in a first position and able to be moved from the first position to a second position by the interruption element when the additional functional module 5 is received in the second reception area 9' so as to interrupt the flow of the current between the first connection pole 3 and the second connection pole 4. In this case, the interruption element may be a rod able to move the shunt from the first position to the second position counter to a spring. In FIG. 6, the additional functional module 5 is not received in the second reception area 9' and the shunt 28 adopts the first position. In FIG. 7, the additional functional module 5 is received in the second reception area 9' and the shunt adopts the second position.

The interruption element may be a first blocking element able to block the interruption device 2" in an open position when the additional functional module 5 is received in the second reception area 9'. In this case, the first blocking element may be a rod acting on the interruption device 2".

Said primary functional module 2 may comprise at least a first connection terminal 3' connected to the first connection pole 3 and a second connection terminal 4' connected to the second connection pole 4, the first connection terminal 3' and the second connection terminal 4' being able to form a first outlet.

According to one alternative possibility, said primary functional module 2 may comprise at least a first conductive wire connected to the first connection pole 3 and a second conductive wire connected to the second connection pole 4, the first conductive wire and the second conductive wire being able to be connected to a terminal block of the additional functional module 5.

Said electrical apparatus 1' may furthermore comprise a control member 2' able to act on the interruption device 2" so as to allow a change from the open position of the interruption device 2" to the closed position of the interruption device 2" and/or to allow a change from the closed position of the interruption device 2" to the open position of the interruption device 2".

Said electrical apparatus 1' may comprise a first housing 15 with which the first outlet 13 and/or the control member 2' are assembled.

Said reception module 8 may comprise a support frame 8' comprising a central opening 17 at least partly forming said first and second reception areas 9, 9' receiving the first housing 15 and being able to receive a second housing 16 of the additional functional module 5, the first housing 15 being able to comprise removable fastening means 18, 19 interacting with the support frame 8'.

Said additional functional module 5 comprising the means for performing at least one function requiring an electric power supply may be able to be received in the second reception area 9' of the electrical apparatus 1', the additional functional module 5 being able to comprise at least a fourth connection pole 6 and a fifth connection pole 7 that are able to be electrically connected respectively to the first connection pole 3 and to the second connection pole 4 of the primary functional module 2 of the electrical apparatus 1' in order to supply power to the additional functional module 5, in which additional functional module 5 either the additional functional module 5 comprises an interruption element able to act on the interruption device 2" so as to interrupt the flow of the current between the first connection pole 3 and the second connection pole 4 when the additional functional module 5 is received in the second reception area 9' of the electrical apparatus 1', or the additional functional module 5 is able to act on an interruption element of the electrical apparatus 1' acting on the interruption device 2" so as to interrupt the flow of the current between the first connection pole 3 and the second connection pole 4 when the additional functional module 5 is received in the second reception area 9' of the electrical apparatus 1' (FIGS. 2A to 2E and 3B).

The interruption element may therefore be present either on the apparatus 1' or on the additional functional module 5. In these two cases, the interruption element is designed to be able to act on the interruption device 2" so as to interrupt the flow of the current between the first connection pole 3 and the second connection pole 4 when the additional functional module 5 is received in the second reception area 9'.

Figure 5:
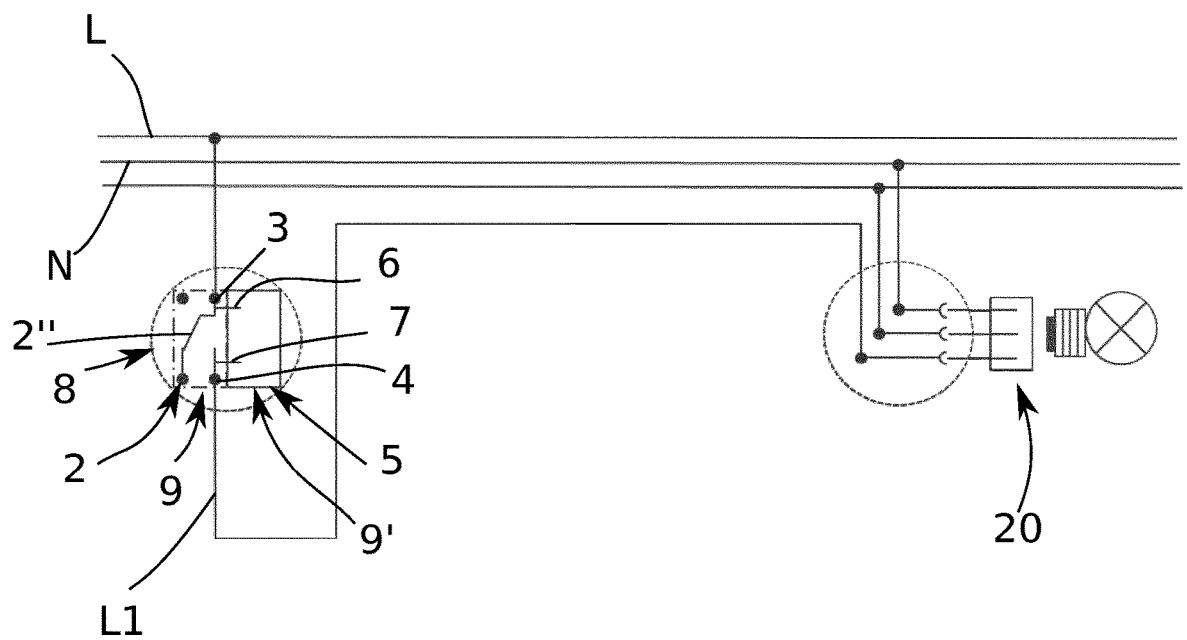
FIG. 5 is a view of a circuit diagram showing the electrical assembly installed in an electrical installation.

Said electrical assembly 1 (FIG. 5) comprises an electrical apparatus 1 according to the invention and an additional functional module 5 comprising means for performing at least one function requiring an electric power supply according to the invention, said additional functional module 5 being received in the second reception area 9' of the electrical apparatus 1', the fourth connection pole 6 and the fifth connection pole 7 of the additional functional module being electrically connected respectively to the first connection pole 3 and to the second connection pole 4 of the primary functional module 2 of the electrical apparatus 1' in order to supply power to the additional functional module 5, the interruption element acting on the interruption device 2" so as to interrupt the flow of the current between the first connection pole 3 and the second connection pole 4.

The interruption element may be a first blocking element able to block the interruption device 2" in an open position when the additional functional module 5 is received in the second reception area 9'. In this case, the first blocking element may be a rod acting on the interruption device 2".

Said at least one function of the additional functional module 5 may be a function requiring an electric power supply, excluding an indicator light lighting function linked to the open position and/or the closed position of the control member 2' of the primary functional module 2.

Excluding an indicator light lighting function is understood to mean an indicator light lighting function that is generally implemented by way of an indicator light able and intended to be turned on when the interruption device 2" is in the open position and to be turned off when the interruption device 2" is in the closed position. For example, when the primary functional module 2 controls a load 20, such as lighting, the indicator light is turned on when the lighting is not supplied with power and is therefore turned off, and the indicator light is turned off when the lighting is supplied with power and is therefore turned on. This type of indicator light is most often used to locate and identify the electrical apparatus 1' in darkness in part of a building (not shown), such as a stairwell (not shown).

Advantageously, the electrical assembly 1 makes it possible to perform at least one function beyond the interruption function using the additional functional module 5. Thus, the additional functional module 5 allows the electrical apparatus 1' to be customized. Furthermore, as the additional functional module 5 is optional, it is able to be installed or removed at any time without impacting the electrical installation. Specifically, the electrical apparatus 1' is able to operate as such, without an additional functional module 5 being received in the second reception area 9' of the electrical apparatus 1'. The electrical apparatus 1' that is obtained is thus particularly flexible and may be easily transformed into an electrical assembly 1 that is capable of performing more sophisticated functions by virtue of the additional functional module 5. Moreover, the additional function of the additional functional module 5 is not intended to inform the user about the location or the state of the interruption function, but advantageously extends to functions independent of the interruption function.

According to one possibility, the electrical apparatus 1' may furthermore comprise a control member 2' able to act on the interruption device 2" so as to allow a change from the open position of the interruption device 2" to the closed position of the interruption device 2" and/or to allow a change from the closed position of the interruption device 2" to the open position of the interruption device 2".

The electrical apparatus 1' and/or the electrical assembly 1 is/are preferably intended to be assembled with or recessed into a support (not shown), such as a wall.

The device 2" for interrupting the current of the primary functional module 2 may be a monostable switch or a bistable switch.

In the case of a monostable switch, in the open position of the control member 2', the control member 2' may be designed not to act on the interruption device 2", which itself also remains in the open position and, in the closed position of the control member 2', the control member 2' may be designed to change the interruption device 2" to the closed position. In this configuration, the monostable switch module is also called "normally open". According to one alternative of a monostable switch module, in the open position of the control member 2', the control member 2' may be designed to change the interruption device 2" to the closed position and, in the closed position of the control member 2', the control member 2' does not act on the closure of the interruption device 2". In this configuration, the monostable switch module is also called "normally closed". The control member 2' of a monostable switch module may preferably be a pushbutton (not shown).

For a bistable switch module, in the open position of the control member 2', the control member 2' may be designed to change the interruption device 2" to the open position and, in the closed position of the control member 2', the control member 2' may be designed to change the interruption device 2" to the closed position. In this case, the control member 2' may preferably be a toggle switch that is able to adopt two positions. However, this example is not limiting.

The additional functional module 5 may furthermore comprise a second blocking element able to block the control member 2' in the open position when the additional functional module 5 is received in the second reception area 9' of the electrical apparatus 1'.

The primary functional module 2 may comprise a first connection pole 3 able and intended to be connected to a first line L of the electrical grid and a second connection pole 4 able and intended to be connected to a second line L1 of an electrical circuit of the electrical installation.

The first line L may be a power supply line connected to the electrical grid, preferably via a switching device, such as a circuit breaker.

The second line L1 may be a return line of the electrical circuit of the electrical installation for supplying power to a load 20 of the electrical installation, such as lighting.

The first line L and the second line L1 may take the form of one or more cables (not shown).

The electrical installation may preferably be a domestic electrical installation.

According to one possibility, said at least one function of the additional functional module 5 is a function of shaping physical parameters of an electrical signal coming from the first line (L) of the electrical grid.

The additional functional module 5 may comprise at least electrical signal processing means able and intended to perform said function of shaping the physical parameters of the electrical signal.

The processing means may be able and intended to modify the shape of the electrical signal, to vary the voltage of the electrical signal and/or the intensity of the current of the electrical signal, to vary the power of the electrical signal, or to vary the frequency of the electrical signal.

The processing means may be able and intended to be actuated locally or remotely by control means.

The processing means may be chosen from among: a variable speed drive, a relay, a filter, a switch, or a semiconductor transistor, preferably a MOSFET transistor.

The control means may in this case consist of a control unit, of smartphone or remote control type, remote from the electrical apparatus 1 and not forming part of the electrical installation. For example, a wireless link, via electromagnetic wave transmission and/or reception means that are described below, may make it possible to establish communication between the control unit and the processing means. According to one alternative variant, the processing means may be actuated via a control button, remote from the electrical apparatus 1 and forming part of the electrical installation. In this case, the link between the control button and the processing means may be wired or wireless.

Said at least one function of the additional functional module 5 may be chosen, alone or in combination, from among a function of measuring at least one physical parameter and/or an electromagnetic radiation transmission and/or reception function and/or a display function and/or an actuation function and/or a data processing function and/or a function of transforming a physical signal into an electrical signal or vice versa.

Said at least one physical parameter may be temperature, pressure, hygrometry, brightness; these examples are of course nonlimiting.

The electromagnetic radiation transmission and/or reception function may be limited to radiofrequency electromagnetic radiation. This configuration is preferred in particular in order to allow data to be communicated from the electrical assembly 1 to a control unit (not shown) described below.

The function of the additional functional module 5 may be able and intended to be supplied with power and activated when the interruption device 2" of the primary functional module 2 is in the open position.

Advantageously, as the additional functional module 5 is connected in parallel with the electrical circuit between the first connection pole 3 and the second connection pole 4 of the primary functional module 2, the means for performing the function of the additional functional module 5 are able to be supplied with power by the electrical grid when the interruption device 2" of the primary functional module 2 is in the open position, that is to say when the interruption element acts on the interruption device 2" so as to interrupt the flow of the current between the first connection pole 3 and the second connection pole 4, for example by keeping the interruption device 2" in the open position, when the additional functional module is received in the second reception area 9'. This means that, when the interruption device 2" is in the open position, for example when the additional functional module is received in the second reception area 9', the function of the additional functional module 5 may be activated. When the interruption device 2" is in the closed position, the means for performing the function of the additional functional module 5 are short-circuited and therefore not supplied with power and deactivated.

The additional functional module 5 may comprise an electrical energy storage and/or production element and the function of the additional functional module 5 may be able and intended to be supplied with power by said electrical energy storage and/or production element.

Advantageously, the function of the additional functional module 5 is able to be supplied with power by an electrical energy storage and/or production element which may be made independent and autonomous in relation to the electrical grid. As a result, the function of the additional functional module 5 is able to be activated independently of the open or closed position of the primary functional module 2. For example, when the control member 2' is in the closed position, the function of the additional functional module 5 is no longer short-circuited and is therefore able to be supplied with power by the electrical energy storage and/or production element and be activated.

The electrical energy storage and/or production element may be a battery, a capacitor, a piezoelectric generator, a photovoltaic generator, or a thermoelectric generator, for example a Peltier or Seebeck generator.

The additional functional module 5 may comprise at least one measurement sensor able and intended to perform said function of measuring at least one physical parameter.

The measurement sensor may be a temperature sensor, a pressure sensor, a hygrometer, a photodetector, an infrared sensor, a transducer; these examples are of course nonlimiting.

The additional functional module 5 may comprise at least electromagnetic wave transmission and/or reception means able and intended to perform said electromagnetic radiation transmission and/or reception function.

These electromagnetic wave transmission and/or reception means may be a radiofrequency communication element, for example Wi-Fi or Bluetooth, or a repeater. Of course, these examples are not limiting.

Advantageously, these electromagnetic wave transmission and/or reception means make it possible to receive and/or transmit data that may in particular relate to the additional functional module 5. Such electromagnetic wave transmission and/or reception means may in addition establish a wireless communication link with a control unit, such as a computer, a smartphone or a digital tablet or to another additional functional module 5 according to the invention and that would also be equipped with electromagnetic wave transmission and/or reception means. It is thus possible to interact remotely with the electrical assembly 1.

The additional functional module 5 may comprise at least display means able and intended to perform said display function.

Advantageously, these display means make it possible to form a visual interface with a user.

These display means may be a screen.

The additional functional module 5 may comprise at least actuation means able and intended to perform said actuation function.

The actuation means may be an actuator, for example a relay, a solenoid, a micromotor, a piezoelectric mechanism or, in general, any type of means configured so as to transform an electrical quantity into a mechanical quantity or vice versa.

The additional functional module 5 may comprise at least data processing means able and intended to perform said data processing function.

The data processing means may be a microcontroller. These data processing means may for example make it possible to process data coming from the measurement sensor.

The additional functional module 5 may comprise at least image-capturing means, for example a camera.

The additional functional module 5 may comprise at least the transducer able and intended to perform a function of transforming a physical signal into an electrical signal or vice versa.

The transducer may be an electroacoustic transducer, such as a speaker or a microphone.

The transducer may be a vibrator or a diffuser.

The additional functional module 5 may comprise at least one electronic card 10, 11, comprising the measurement sensor and/or the electromagnetic wave transmission and/or reception means and/or the display means and/or the actuation means and/or the data processing means and/or the image-capturing means and/or the transducer.

According to one variant embodiment of the invention, a first electronic card 10 may comprise the measurement sensor and/or the display means and/or the electromagnetic wave reception and/or actuation means and/or a transducer and/or image-capturing means and a second electronic card 11 may comprise the electromagnetic wave transmission and/or reception means and/or the data processing means and a third electronic card (not shown) may comprise the electrical energy storage and/or production element.

The first electronic card 10, the second electronic card 11 and the third electronic card may be electrically connected to one another.

The first electronic card 10 may preferably be a removable component of the additional functional module 5.

Advantageously, the function(s) of the additional functional module 5 may thus be modified simply and easily by replacing the first electronic card 10. It is thus not necessary to replace the entire additional functional module 5.

Figure 2A:
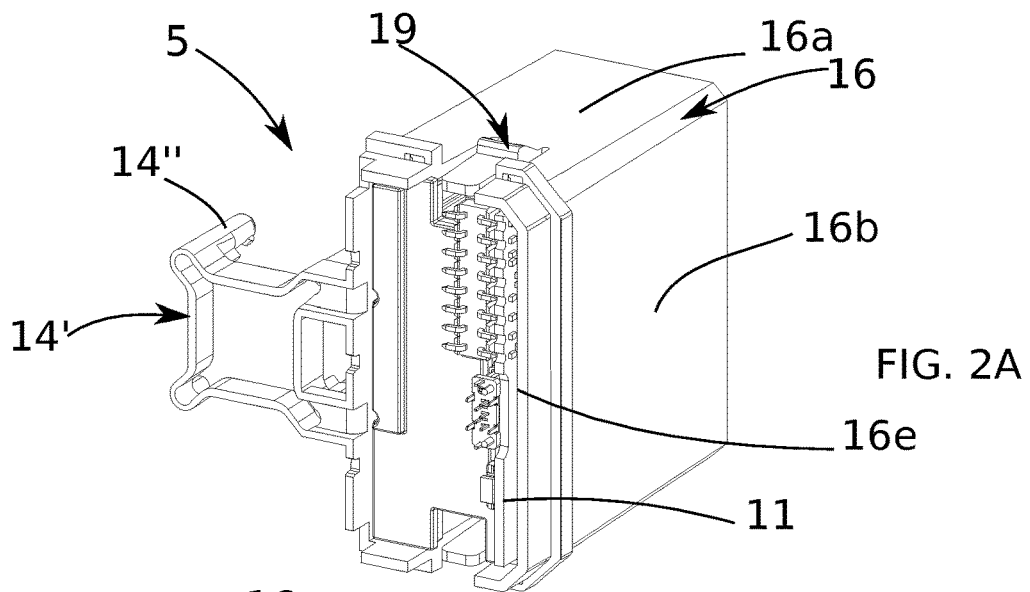
FIG. 2A is a perspective plan view of an additional functional module according to the invention.

In particular, the first electronic card 10 may comprise at least first connection means 24 complementary with at least second connection means 25 of the second electronic card 11. Said connection means make it possible to electrically and mechanically connect the first electronic card 10 and the second electronic card 11 in a removable and reversible manner (FIGS. 2A and 2D).

The first connection means 24 and the second connection means 25 may consist of a USB connection, by way of non-limiting example.

Figure 1A:
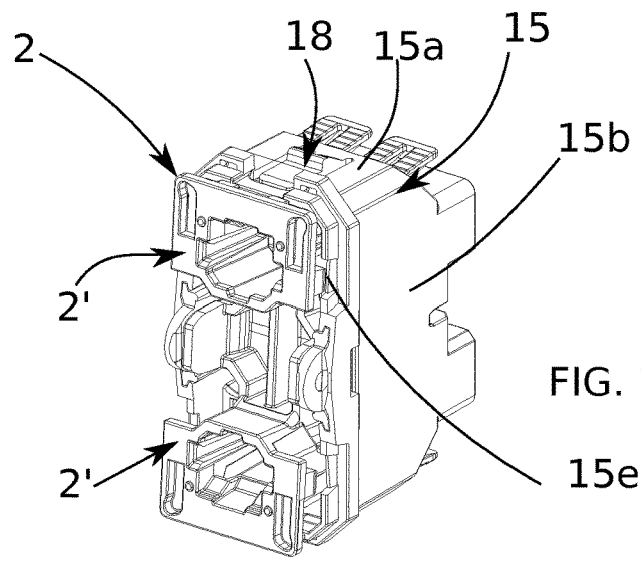
FIG. 1A is a perspective plan view of a primary functional module according to the invention.
Figure 1B:
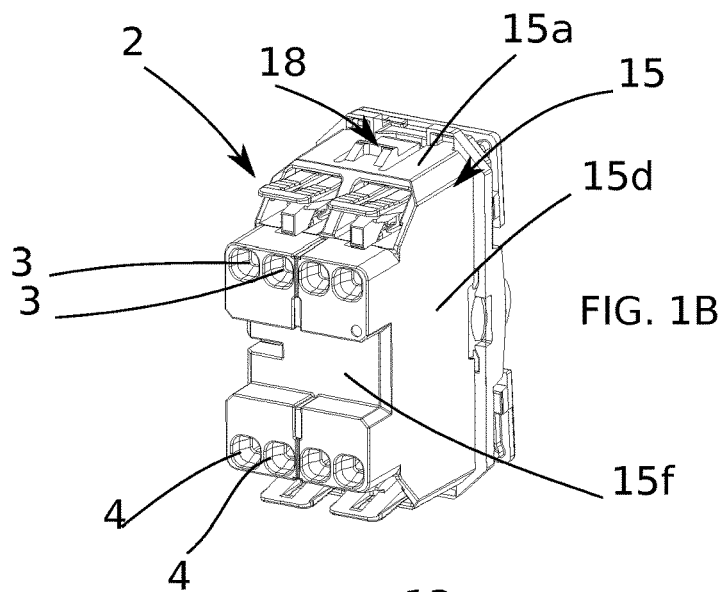
FIG. 1B is a perspective bottom view of the primary functional module shown in FIG. 1A.
Figure 1C:
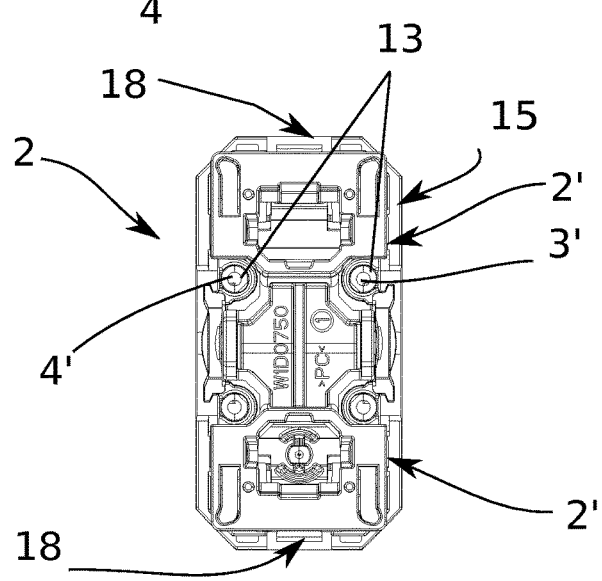
FIG. 1C is a plan view of the primary functional module shown in FIG. 1A.

The primary functional module 2 may comprise at least a first connection terminal 3' electrically connected to the first connection pole 3 and a second connection terminal 4' electrically connected to the second connection pole 4, and the first connection terminal 3' and the second connection terminal 4' may form a first outlet 13 (FIG. 1C). According to one alternative possibility, said primary functional module 2 may comprise at least a first conductive wire connected to the first connection pole 3 and a second conductive wire connected to the second connection pole 4, the first conductive wire and the second conductive wire being able to be connected to a terminal block of the additional functional module 5.

Figure 2B:
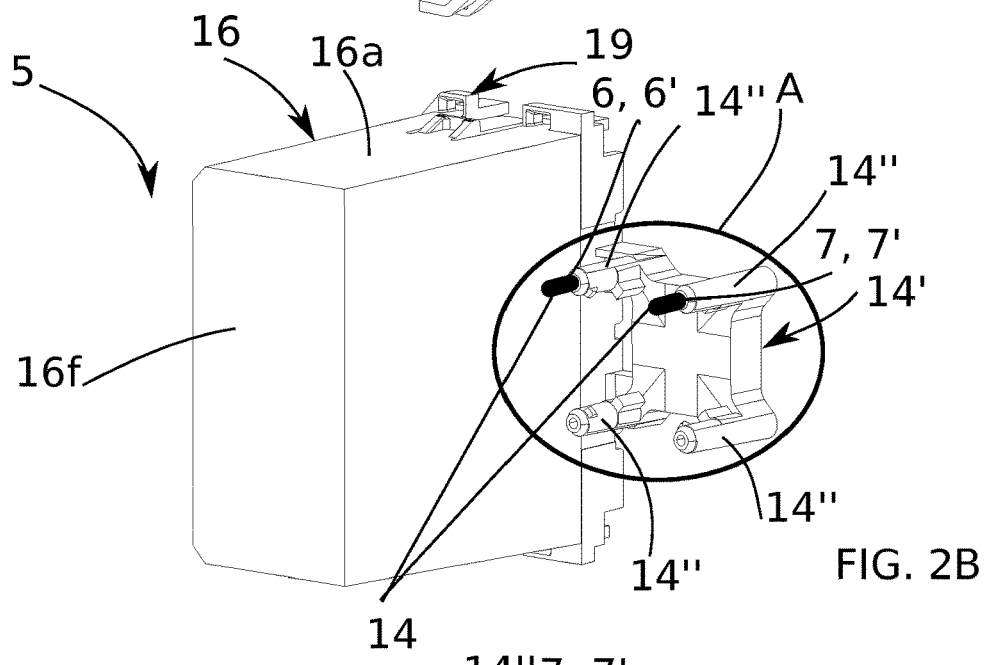
FIG. 2B is a perspective bottom view of the additional functional module shown in FIG. 2A.
Figure 2C:
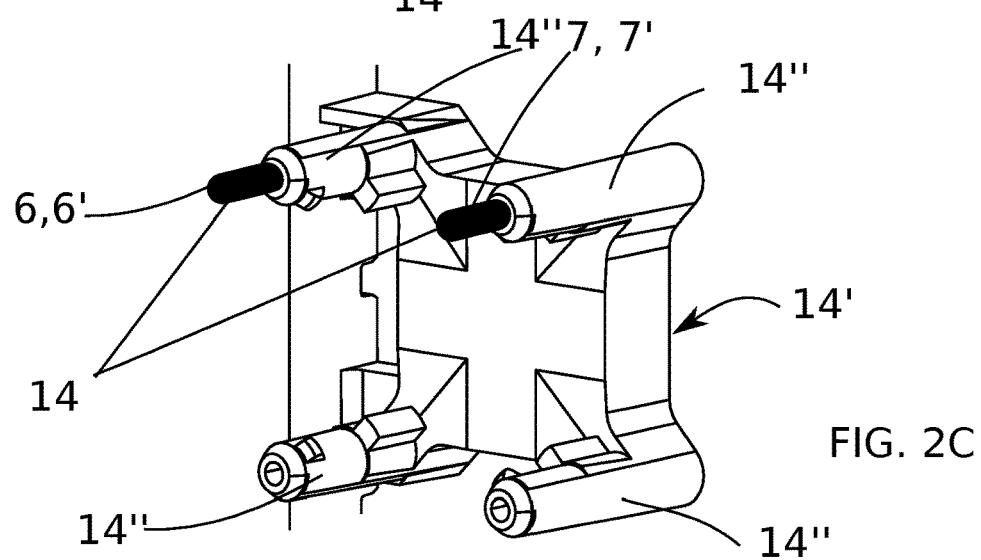
FIG. 2C is a perspective view of the detail A shown in FIG. 2B.
Figure 2D:
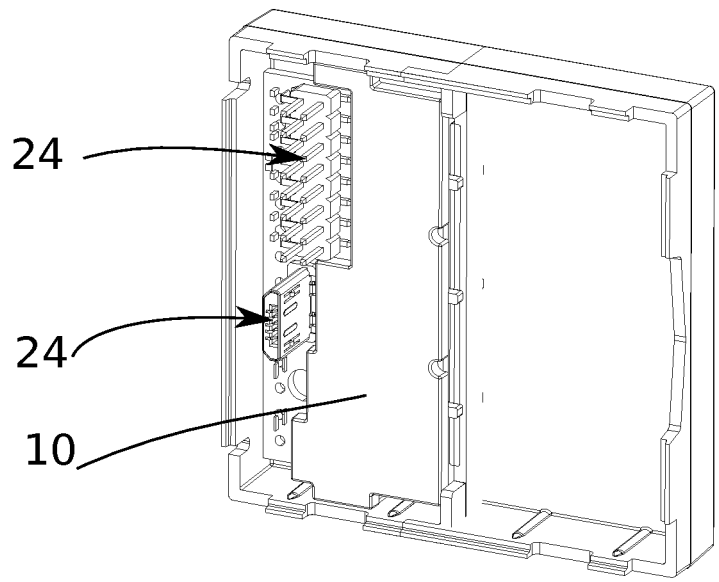
FIG. 2D is a perspective view of a removable electronic card of the additional functional module.
Figure 2E:
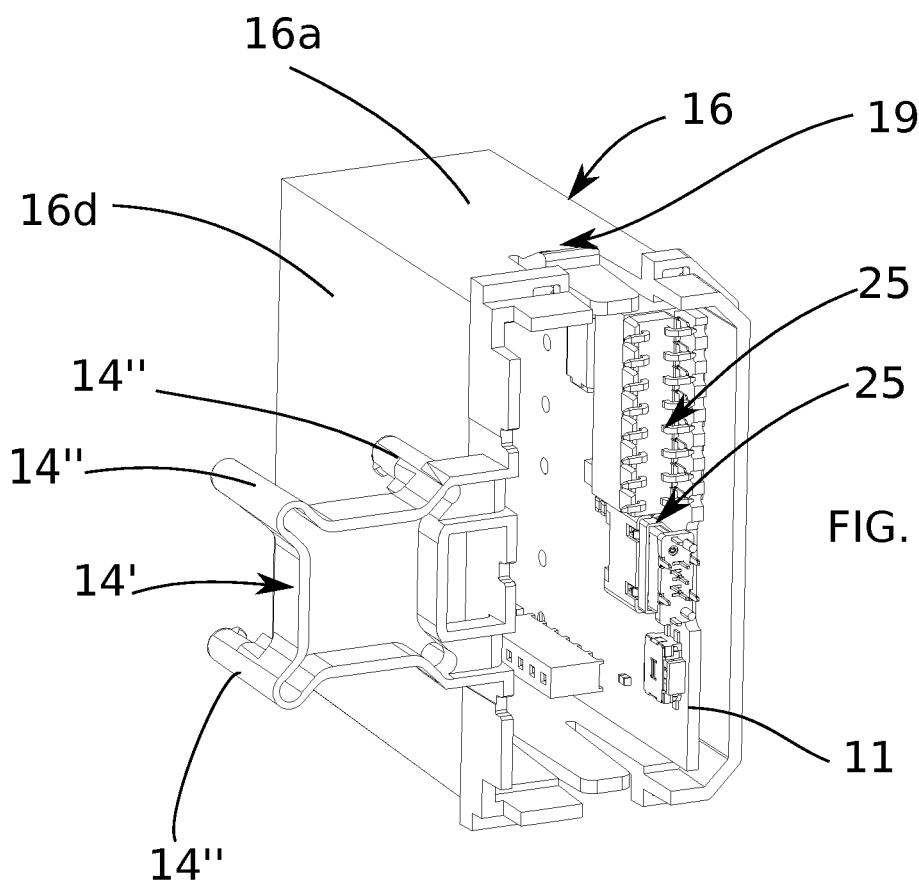
FIG. 2E is a perspective view of the functional module without the removable electronic card.

The additional functional module 5 may comprise at least a fourth connection terminal 6' electrically connected to the fourth connection pole 6 and a fifth connection terminal 7' electrically connected to the fifth connection pole 7, and the fourth connection terminal 6' and the fifth connection terminal 7' may form a second outlet 14 (FIGS. 2B and 2C). According to one alternative possibility, said additional functional module 5 may comprise a terminal block electrically connected to the fourth connection pole 6 and to the fifth connection pole 7. The first conductive wire and the second conductive wire of the primary functional module 2 may be connected to the terminal block.

The first outlet 13 of the primary functional module 2 and the second outlet 14 of the additional functional module 5 may have complementary shapes so as to be connected and so as to electrically and mechanically connect the first connection terminal 3' to the fourth connection terminal 6' and so as to electrically and mechanically connect the second connection terminal 4' to the fifth connection terminal 7' (FIGS. 1C, 2B, 2C, 3B, 5).

The first connection terminal 3' and the second connection terminal 4' may be respectively a first female terminal and a second female terminal, for example taking the form of a cavity provided with electrical contact. In this case, the first outlet 13 is a socket. This first outlet 13 may preferably comprise two cavities distributed along one side of a square (FIG. 1C).

The first socket outlet 13 may preferably have a protection rating whose degree of protection against solids is between 0 and 6 and whose degree of protection against liquids is between 0 and 8. For example, the protection rating may be equal to IP2X, X being a value between 0 and 8.

The fourth connection terminal 6' and the fifth connection terminal 7' may be respectively a fourth male terminal and a fifth male terminal, for example taking the form of a rod. In this case, the second outlet 14 is a plug. The second outlet 14 may comprise a base 14' from which the fourth connection terminal 6' and the fifth connection terminal 7' in the form of a rod extend. The base 14' preferably has a substantially square shape with rounded corners from which four pads 14'' extending substantially orthogonal to the base 14' extend. These pads 14'' form a mechanical joint with the first socket outlet 13, these pads 14'' being able to fit into the cavities. Two of these pads 14'' may support the two rods forming the fourth connection terminal 6' and the fifth connection terminal 7' (FIGS. 2A, 2B, 2C, 2E).

The primary functional module 2 may comprise a first housing 15 with which the first outlet 13 and the control member 2' are assembled (FIGS. 1A, 1B and 1C).

The first housing 15 makes it possible to protect the primary functional module 2.

The first housing 15 may be made from polymer material.

The first housing 15 may comprise four lateral faces 15a, 15b, 15d, a front opening 15e, and a rear face 15f. The first housing 15 may have a substantially rectangular cross section.

The first outlet 13 and the control member 2' preferably cover the front opening 15e. As a result, the first outlet 13 is advantageously accessible from the front of the primary functional module 2, thereby facilitating interlocking with the second outlet 14 of the additional functional module 5.

The additional functional module 5 may comprise a second housing 16 in which said at least one electronic card 10, 11, 12 comprising the measurement sensor and/or the electromagnetic wave transmission and/or reception means and/or the display means and/or the actuation means and/or the data processing means and/or the transducer is housed.

The second housing 16 makes it possible to protect the additional functional module 5 (FIGS. 2A and 2B).

The second outlet 14 of the additional functional module 5 may project from the second housing 16 of the additional functional module 5.

The second housing 16 may be made from polymer material.

The second housing 16 may comprise four lateral faces 16a, 16b, 16c, 16d, a front opening 16e, and a rear face 16f. The second housing 16 may have a substantially rectangular cross section.

Preferably, the base 14' of the second outlet 14 may extend in the plane of the front opening 16e and the pads 14" may extend in the direction of the lateral faces 16a, 16b, 16d.

The second housing 16, the base 14' and the pads 14" may form a single one-piece component, which is for example molded.

Alternatively, the second outlet 14 may be a removable element (not shown) of the second housing 16. More particularly, the base 14' may be mechanically connected to the second housing 16 removably and reversibly by mechanical connection means (not shown). The base 14' may furthermore comprise electrical connection means (not shown) electrically connected to the fourth connection terminal 6' and to the fifth connection terminal 7' and complementary with electrical connection means (not shown) arranged on the second housing 16. These electrical connection means of the second housing 16 may consist of a terminal block.

One of the lateral faces 15b of the first housing 15a may be adjacent to one of the lateral faces 16d of the second housing 16, more particularly these lateral faces 15b, 16d may be contiguous and facing one another. These contiguous lateral faces 15b, 16d may comprise guide means (not shown) in order to facilitate the positioning of the first and second housings 15, 16 with respect to one another.

The first electronic card 10 may cover the front opening 16e.

Advantageously, due to this configuration, the first electronic card 10 is easily accessible and may easily be secured/detached to/from the second electronic card 11 in order to be replaced.

The reception module 8 may comprise a support frame 8' comprising a central opening 17 at least partly forming said first and second reception areas 9, 9' receiving the first housing 15 (FIGS. 3A, 3B, 3D) and the second housing 16, and the first housing 15 and the second housing 16 may respectively comprise removable fastening means 18, 19 interacting with the support frame 8' (FIGS. 1A, 1B, 2A, 2B).

The fastening means 18, 19 respectively of the first housing 15 and of the second housing 16 may preferably consist of two tabs projecting respectively from two of the opposing lateral faces 15a, 15c; 16a, 16c (FIGS. 1A, 1B, 1C, 2A, 2B and 2D).

The reception module 8 may also comprise a recessed housing 8" to which the support frame 8' is able to be fastened by fastening means (not shown). This recessed housing 8" may be intended to be recessed into a support, such as a wall.

The recessed housing 8' may comprise a receptacle for receiving the four lateral faces 15a, 15b, 15d and the rear face 15f of the first housing 15 and the four lateral faces 16a, 16b, 16d and the rear face 16f of the second housing 16.

Figure 3C:
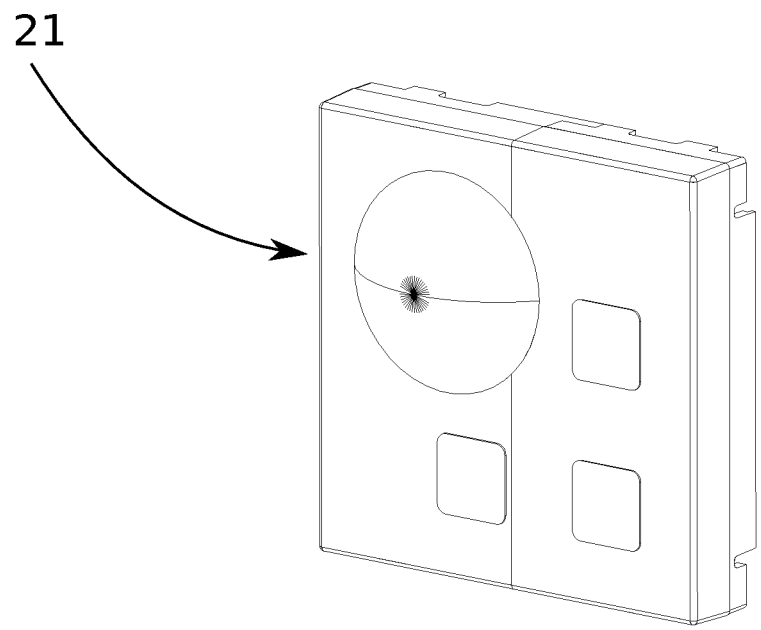
FIG. 3C is a perspective view of a cover plate according to the invention.
Figure 3D:
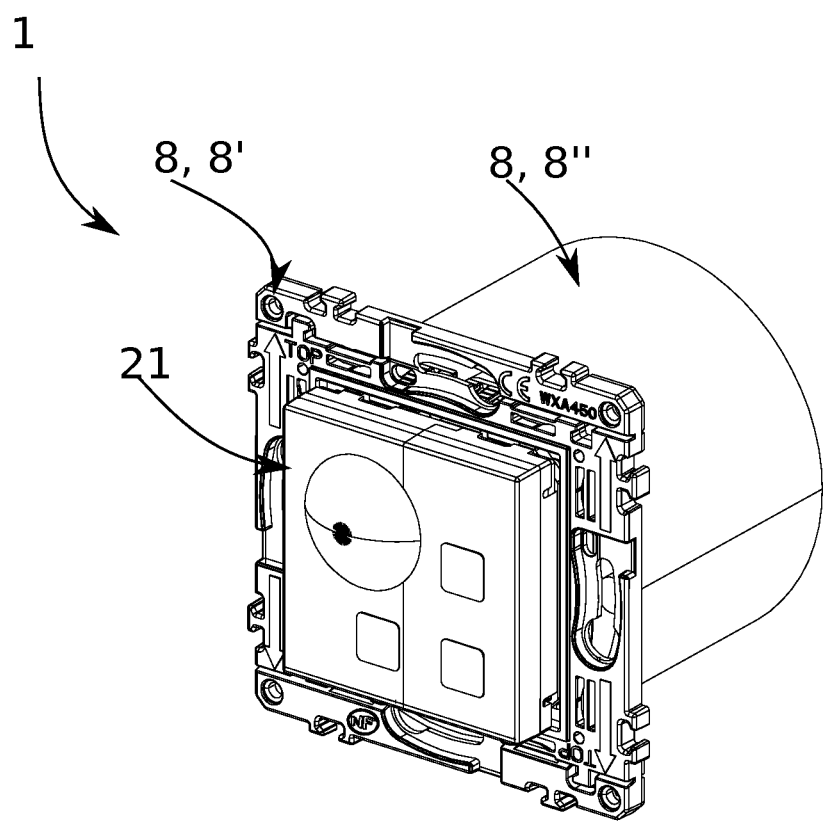
FIG. 3D is a perspective view of the electrical apparatus shown in FIG. 3B and provided with a cover plate shown in FIG. 3C.
Figure 4:
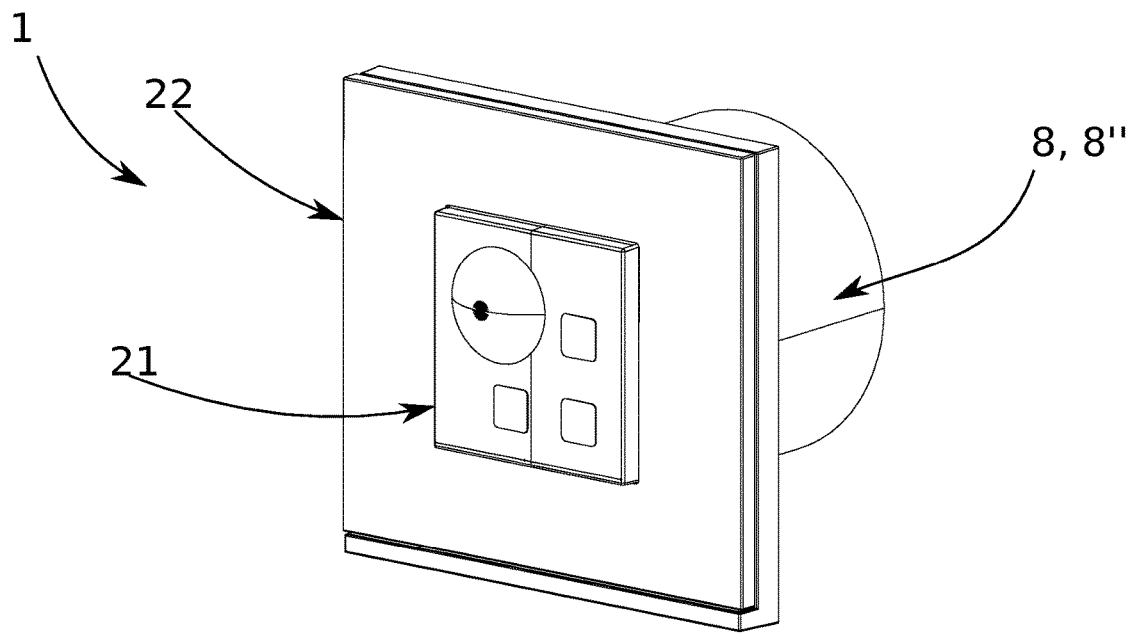
FIG. 4 is a view of the electrical apparatus according to the invention.

The control member 2', the base 14' of the second outlet 14 and the first electronic card 10 may be covered with at least one cover plate 21 comprising or not comprising at least one button (not shown) which allows the control member 2' of the primary functional module 2 to be actuated (FIGS. 3C, 3D, 4).

The cover plate 21 simultaneously plays the role of an interface with the user and may also have an esthetic function and a protective function.

The cover plate 21 may also make it possible to block off the control member 2', which is no longer able to be actuated in this case. In this case, the cover plate 21 may comprise the second blocking element able to block the control member 2'.

The support frame 8' may be covered with a covering frame 22.

The invention also relates to an electronic card 10 for an additional functional module 5 as described above.

According to the invention, the electronic card 10 is characterized in that it comprises a measurement sensor and/or display means and/or actuation means and in that it comprises at least first connection means 24 so as to be able and intended to form a removable component of said additional functional module 5.

This electronic card corresponds to the first electronic card 10 as described above.

Of course, the invention is not limited to the embodiments that are described and shown in the appended drawings. Modifications remain possible, particularly from the point of view of the composition of the various elements or by substituting technical equivalents, without otherwise departing from the scope of protection of the invention.

The invention claimed is:

1. An electrical apparatus for an electrical installation, able to be connected to an electrical grid, comprising at least:
   a reception module comprising at least a first reception area;
   a primary functional module received in the first reception area and comprising a first connection pole able to be connected to a first line of the electrical grid and a second connection pole able to be connected to a second line of an electrical circuit of the electrical installation,
   the primary functional module comprising a device for interrupting the current, which device is arranged between the first connection pole and the second connection pole and is able, in an open position, to interrupt the current between the first connection pole and the second connection pole and, in a closed position, to allow the passage of the current between the first connection pole and the second connection pole,
   wherein the reception module comprises a second reception area for receiving an additional functional module, said additional functional module having means for performing at least one function requiring an electric power supply, at least a fourth connection pole and a fifth connection pole that are able to be electrically connected respectively to the first connection pole and to the second connection pole of the primary functional module in order to supply power to the additional functional module, and in that either the electrical apparatus comprises an interruption element able to act on the interruption device so as to interrupt the flow of the current between the first connection pole and the second connection pole when the additional functional module is received in the second reception area, or an interruption element of the additional functional module is able to act on the interruption device so as to interrupt the flow of the current between the first connection pole and the second connection pole when the additional functional module is received in the second reception area.

2. The electrical apparatus as claimed in claim 1, wherein the interruption device furthermore comprises a shunt able to establish the flow of the current between the first connection pole and the second connection pole in a first position and able to be moved from the first position to a second position by the interruption element when the additional functional module is received in the second reception area so as to interrupt the flow of the current between the first connection pole and the second connection pole.

3. The electrical apparatus as claimed in claim 1, wherein the interruption element is a first blocking element able to block the interruption device in an open position when the additional functional module is received in the second reception area.

4. The electrical apparatus as claimed in claim 1, wherein the primary functional module comprises at least a first connection terminal electrically connected to the first connection pole and a second connection terminal electrically connected to the second connection pole, and in that the first connection terminal and the second connection terminal form a first outlet.

5. The electrical apparatus as claimed in claim 1, wherein said electrical apparatus furthermore comprises a control member able to act on the interruption device so as to allow a change from the open position of the interruption device to the closed position of the interruption device and/or to allow a change from the closed position of the interruption device to the open position of the interruption device.

6. The electrical apparatus as claimed in claim 1, wherein said electrical apparatus comprises a first housing with which the first outlet and/or the control member are assembled.

7. The electrical apparatus as claimed in claim 6, wherein the reception module comprises a support frame comprising a central opening at least partly forming said first and second reception areas receiving the first housing and being able to receive a second housing of the additional functional module, and in that the first housing comprises removable fastening means interacting with the support frame.

8. An additional functional module having means for performing at least one function requiring an electric power supply, for an electrical apparatus as claimed in claim 1, wherein said additional functional module is able to be received in the second reception area of the electrical apparatus, the additional functional module comprising at least a fourth connection pole and a fifth connection pole that are able to be electrically connected respectively to the first connection pole and to the second connection pole of the primary functional module of the electrical apparatus in order to supply power to the additional functional module, and in that either the additional functional module comprises an interruption element able to act on the interruption device so as to interrupt the flow of the current between the first connection pole and the second connection pole when the additional functional module is received in the second reception area of the electrical apparatus, or the additional functional module is able to act on an interruption element of the electrical apparatus acting on the interruption device so as to interrupt the flow of the current between the first connection pole and the second connection pole when the additional functional module is received in the second reception area of the electrical apparatus.

9. The additional functional module as claimed in claim 8, wherein the interruption element is a first blocking element able to block the interruption device in an open position when the additional functional module is received in the second reception area.

10. The additional functional module as claimed in claim 8, wherein said at least one function of the additional functional module is a function requiring an electric power supply, excluding an indicator light lighting function linked to the open position and/or the closed position of the interruption device of the primary functional module.

11. The additional functional module as claimed in claim 8, wherein said at least one function of the additional functional module is chosen, alone or in combination, from among a function of measuring at least one physical parameter and/or an electromagnetic radiation transmission and/or reception function and/or a display function and/or an actuation function and/or a data processing function and/or a function of transforming a physical signal into an electrical signal or vice versa.

12. The additional functional module as claimed in claim 11, wherein said additional functional module comprises at least one measurement sensor able to perform said function of measuring at least one physical parameter.

13. The additional functional module as claimed in claim 11, wherein said additional functional module comprises at least electromagnetic wave transmission and/or reception means able to perform said electromagnetic radiation transmission and/or reception function.

14. The additional functional module as claimed in claim 11, wherein said additional functional module comprises at least display means able to perform said display function.

15. The additional functional module as claimed in claim 11, wherein said additional functional module comprises at least actuation means able to perform said actuation function.

16. The additional functional module as claimed in claim 11, wherein said additional functional module comprises at least data processing means able to perform said data processing function.

17. The additional functional module as claimed in claim 8, wherein said additional function module comprises an electrical energy storage and/or production element, and in that the function of the additional functional module is able to be supplied with power by said electrical energy storage and/or production element.

18. The additional functional module as claimed in claim 8, wherein said additional functional module comprises at least one electronic card comprising the measurement sensor and/or the electromagnetic wave transmission and/or reception means and/or the display means and/or the actuation means and/or the data processing means.

19. The module as claimed in claim 18, wherein a first electronic card comprises the measurement sensor and/or the display means and/or the actuation means and/or the electromagnetic wave transmission and/or reception means and/or a transducer and a second electronic card comprises the electromagnetic wave transmission and/or reception means and/or the data processing means and a third electronic card comprises the electrical energy storage and/or production element.

20. The module as claimed in claim 19, wherein the first electronic card is a removable component of said primary functional module.

21. The module as claimed in claim 20, wherein the first electronic card comprises at least first connection means complementary with at least second connection means of the second electronic card.

22. The additional functional module as claimed in claim 18, wherein said additional functional module comprises a second housing in which said at least one electronic card comprising the measurement sensor and/or the electromagnetic wave transmission and/or reception means and/or the display means and/or the actuation means and/or the data processing means and/or a transducer is housed.

23. The additional functional module as claimed in claim 8, wherein said additional functional module comprises at least a fourth connection terminal electrically connected to the fourth connection pole and a fifth connection terminal electrically connected to the fifth connection pole, and in that the fourth connection terminal and the fifth connection terminal form a second outlet.

24. The additional functional module as claimed in claim 23 wherein said additional functional module comprises a second housing in which said at least one electronic card comprising the measurement sensor and/or the electromagnetic wave transmission and/or reception means and/or the display means and/or the actuation means and/or the data processing means and/or a transducer is housed, characterized in that the second outlet projects from the second housing and wherein the second outlet projects from the second housing.

25. The additional functional module as claimed in claim 8, wherein the function of the additional functional module is able to be supplied with power and activated when the interruption device of the primary functional module is in the open position and/or when the shunt is moved to the second position.

26. The additional functional module as claimed in claim 8, wherein the second housing comprises removable fastening means able to interact with a support frame of the electrical apparatus.

27. The additional functional module as claimed in claim 8, wherein said additional functional module furthermore comprises a second blocking element able to block the control member in the open position when the additional functional module is received in the second reception area of the electrical apparatus.

28. An electronic card for an additional functional module as claimed in claim 8, wherein the electronic card (10) comprises a measurement sensor and/or display means and/or actuation means and/or electromagnetic wave transmission and/or reception means and/or a transducer and in that it comprises at least first connection means so as to be able to form a removable component of said primary functional module.

29. An electrical assembly comprising an electrical apparatus as claimed in claim 1 and an additional functional module having means for performing at least one function requiring an electric power supply, said additional functional module is received in the second reception area of the electrical apparatus, the fourth connection pole and the fifth connection pole of the additional functional module being electrically connected respectively to the first connection pole and to the second connection pole of the primary functional module of the electrical apparatus in order to supply power to the additional functional module, the interruption element acting on the interruption device so as to interrupt the flow of the current between the first connection pole and the second connection pole.

* * * * *